(12) United States Patent
Joo et al.

(10) Patent No.: US 7,859,939 B2
(45) Date of Patent: Dec. 28, 2010

(54) SEMICONDUCTOR MEMORY DEVICE

(75) Inventors: Yong-Suk Joo, Gyeonggi-do (KR);
Joo-Hwan Cho, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 194 days.

(21) Appl. No.: 12/327,023

(22) Filed: Dec. 3, 2008

(65) Prior Publication Data

US 2010/0008177 A1 Jan. 14, 2010

(30) Foreign Application Priority Data

Jul. 10, 2008 (KR) ...................... 10-2008-0067150

(51) Int. Cl.
*G11C 8/00* (2006.01)
(52) U.S. Cl. ............................... 365/233.1; 365/189.07
(58) Field of Classification Search .............. 365/233.1, 365/189.07, 189.08
See application file for complete search history.

(56) References Cited

U.S. PATENT DOCUMENTS 6,000,022 A * 12/1999 Manning ..................... 711/167
6,768,698 B2 * 7/2004 Kono ....................... 365/233.1

FOREIGN PATENT DOCUMENTS

KR 1020030080534 A 10/2003

OTHER PUBLICATIONS

Notice of Allowance issued from Korean Intellectual Property Office on Jan. 26, 2010.

* cited by examiner

*Primary Examiner*—Anh Phung
(74) *Attorney, Agent, or Firm*—IP & T Group LLP (57) ABSTRACT

A semiconductor memory device includes a clock input unit configured to receive a first clock and a second clock from the external. The memory device further includes a frequency conversion unit configured to convert a frequency of the second clock so that the frequency of the second clock becomes identical to a frequency of the first clock, a phase comparison unit configured to compare a phase of the first clock with that of a clock outputted from the frequency conversion unit, and output a comparison signal corresponding to the comparison result, a logic level change unit configured to change a logic level of a training information signal when a logic level of the comparison signal is fixed for a given time after being changed, and a signal transfer unit configured to transfer the training information signal to the external.

14 Claims, 6 Drawing Sheets

SEMICONDUCTOR MEMORY DEVICE

CROSS-REFERENCE TO RELATED APPLICATIONS

This application claims priority of Korean patent application number 10-2008-0067150, filed on Jul. 10, 2008, which is incorporated by reference in its entirety.

BACKGROUND OF THE INVENTION

The present subject matter relates to a semiconductor design technology, and more particularly, to a clock alignment training operation required in a semiconductor memory device operating at a high speed. In particular, the present subject matter relates to a circuit for preventing a wrong result caused by noise or jitter during the clock alignment training operation from being transferred to an external controller.

In a system including a plurality of semiconductor devices, a semiconductor memory device is used to store data. If a data processing device, e.g., a memory control unit, requires data, the semiconductor memory device outputs data corresponding to addresses coupled from the device requiring the data read-out or stores data provided from the device requiring the data writing in a position corresponding to addresses coupled from the device.

For this purpose, a memory device that is recently being developed and operates at a high speed is designed to input/output two data between a rising edge and a falling edge of a system clock fed from the external, and then to input/output two data between the falling edge and the next rising edge of the system clock. That is, the memory device is designed to input/output 4 data in one period of the system clock.

However, since the system clock is only expressed with two states, i.e., logic high or logic low, there is required a data clock having a frequency that is two times higher than that of the system clock in order to input/output 4 data in one period of the system clock. That is, an exclusive clock is required for such a data input/output.

The semiconductor memory device operating at a high speed uses the system clock as a reference clock when receiving addresses and commands while using the data clock as the reference clock when inputting/outputting data. Therefore, such a semiconductor memory device controls the data clock to have a frequency twice higher than that of the system clock.

By making the data clock to repeat twice for one period of the system clock and the data input/output to occur on each of a rising edge and a falling edge of the data clock, 4 data can be input/output for one period of the system clock.

Unlike a conventional double data rate (DDR) synchronous memory device that uses the system clock as a reference clock to perform a reading or writing operation, the semiconductor memory device operating at a high speed exchanges data using two clocks having different frequencies from each other to perform the reading or writing operation.

However, if a phase of the system clock is not aligned with that of the data clock, a transfer standard of operational commands and addresses is not aligned with a transfer standard of data. In other words, the high-speed operating semiconductor memory device can not normally operate.

Therefore, to make the high-speed operating semiconductor memory device normally operate, an interface training operation between the semiconductor memory device and a data processing device should be performed at the beginning of the operation of the semiconductor memory device.

Herein, the interface training is a training of an interface, which transfers commands, addresses and data to operate at an optimized point before a normal operation is performed between the semiconductor memory device and the data processing device.

The interface training includes address training, clock alignment training (WCK2CK training), read training and write training. Among them, an operation of aligning the data clock and the system clock is performed in the clock alignment training.

Figure 1:
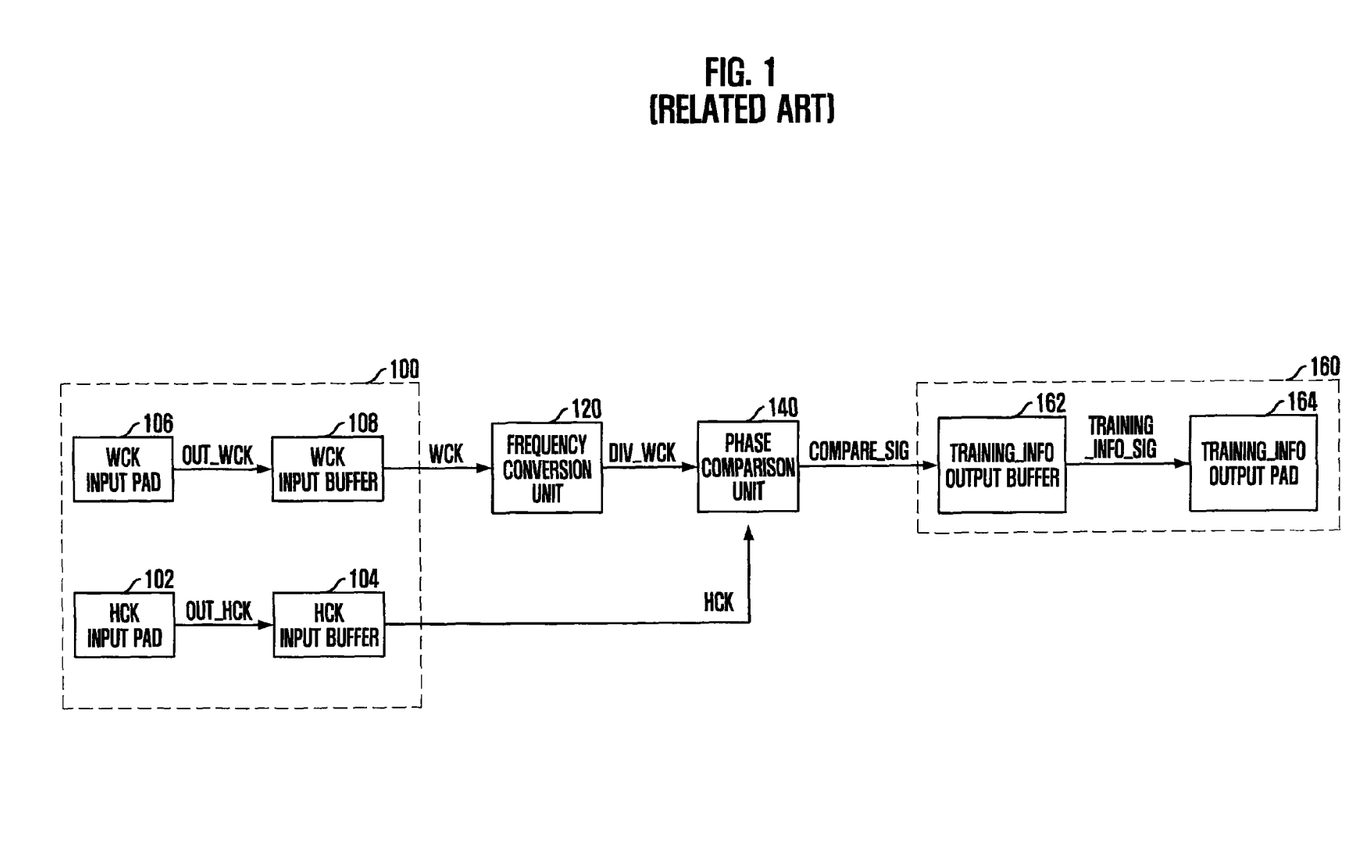
FIG. 1 illustrates a block diagram of a conventional circuit for performing a clock alignment training operation.

FIG. 1 illustrates a block diagram of a conventional circuit for performing the clock alignment training.

According to the clock alignment training, as described above, the high-speed operating semiconductor memory device receives an address signal and a command signal from an external controller on the basis of a system clock HCK and outputs data stored therein to the external controller on the basis of a data clock WCK.

Therefore, if there is a phase difference between the system clock HCK and the data clock WCK, the data stored in the semiconductor memory device arrives at the external controller faster or later as long as a time corresponding to the phase difference.

Thus, the phase difference between the data clock WCK and the system clock HCK, supplied from the external controller, is detected at the beginning of the operation of the high-speed operating semiconductor memory device and the detection result is transferred to the external controller to reduce the phase difference between the system clock HCK and the data clock WCK. This operation is referred to as the clock alignment training.

That is, the conventional circuit for performing the clock alignment training illustrated in FIG. 1 receives a data clock OUT_WCK and a system clock OUT_HCK from the external controller, buffers the data clock OUT_WCK and the system clock OUT_HCK to output a data clock WCK and a system clock HCK, detects the phase difference between the data clock WCK and the system clock HCK, and transfers the detection result to the external controller.

Referring to FIG. 1, the circuit for performing the clock alignment training includes a clock input unit 100, a frequency conversion unit 120, a phase comparison unit 140 and a signal transfer unit 160.

The clock input unit 100 receives the system clock OUT_HCK and the data clock OUT_WCK from the external controller, wherein the system clock OUT_HCK synchronizes input points of an address signal and a command signal, and the data clock OUT_WCK synchronizes an input point of a data signal and has a frequency higher than that of the system clock OUT_HCK. The clock input unit 100 includes a system clock (HCK) input pad 102 for receiving a system clock OUT_HCK from the external controller, a system clock (HCK) input buffer 104 for buffering the system clock OUT_HCK coupled through the HCK input pad 102 and outputting the system clock HCK, a data clock (WCK) input pad 106 for receiving a data clock OUT_WCK from the external controller, wherein the data clock OUT_WCK has a frequency higher than that of the system clock OUT_HCK, and a data clock (WCK) input buffer 108 for buffering the data clock OUT_WCK coupled through the WCK input pad 106 and outputting the data clock WCK.

The frequency conversion unit 120 converts the frequency of the data clock WCK so that the frequency of the data clock WCK becomes identical to that of the system clock HCK.

The phase comparison unit 140 compares a phase of the system clock HCK with a phase of a clock DIV_WCK outputted from the frequency conversion unit 120 and generates a comparison signal COMPARE_SIG corresponding to the comparison result.

The signal transfer unit 160 transfers the comparison signal COMPARE_SIG to the external controller as a training information signal TRAINING_INFO_SIG. The signal transfer unit 160 includes a training information signal (TRAINING_INFO) output buffer 162 for buffering the comparison signal COMPARE_SIG and a training information signal (TRAINING_INFO) output pad 164 for transferring the training information signal TRAINING_INFO_SIG outputted from the TRAINING_INFO output buffer 162 to the external controller.

Figure 2:
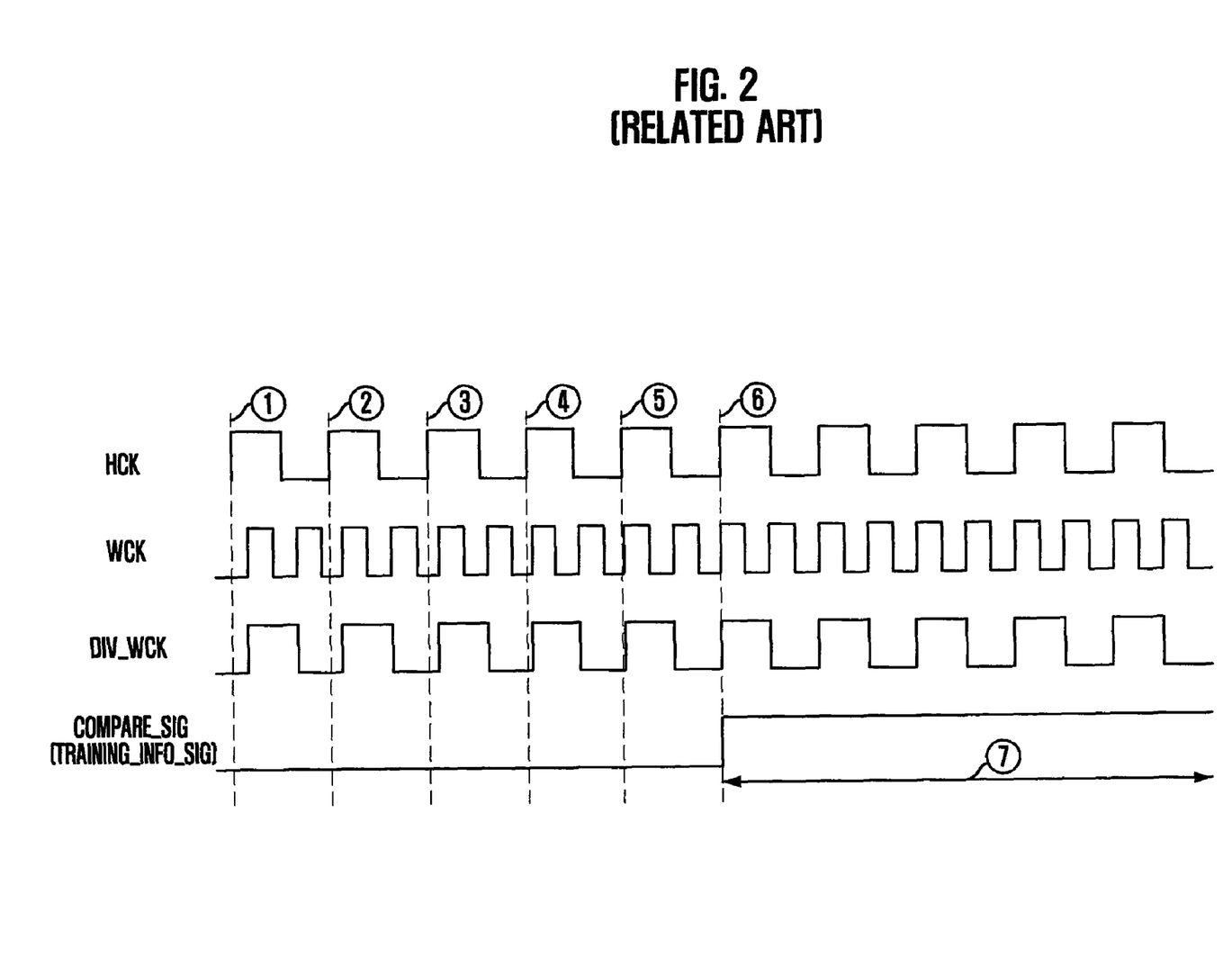
FIG. 2 is a timing diagram illustrating operational waveforms in case that the circuit illustrated in FIG. 1 performs the clock alignment training operation in a normal state.

FIG. 2 is a timing diagram illustrating operational waveforms in case that the circuit illustrated in FIG. 1 performs the clock alignment training in a normal state.

Referring to FIG. 2, although the frequency of the data clock WCK that is inputted to the circuit of performing the clock alignment training according to the prior art from the external controller is higher than that of the system clock HCK, the frequency of the data clock DIV_WCK outputted from the frequency conversion unit 120 becomes identical to that of the system clock HCK since the frequency conversion unit 120 converts the frequency of the data clock WCK.

Before the clock alignment training operation starts, i.e., in a period ①, clock edges of the data clocks WCK and DIV_WCK are not synchronized with that of the system clock HCK. That is, in the period ①, phases of the data clocks WCK and DIV_WCK and the system clock HCK are not synchronized with each other.

After the clock alignment training operation starts, i.e., in periods ②, ③, ④, ⑤ and ⑥, in order to synchronize the data clocks WCK and DIV_WCK with the system clock HCK, the phases of the data clocks WCK, DIV_WCK are changed while the phase of the system clock HCK is fixed.

Herein, the phases of the data clocks WCK and DIV_WCK are changed corresponding to a logic level of the training information signal COMPARE_SIG (TRAINING_INFO_SIG) that is transmitted to the external controller through the signal transfer unit 160.

In particular, in the periods ②, ③, ④, ⑤ and ⑥, in which the phases of the data clocks WCK and DIV_WCK are varying since the phases of the data clocks WCK and DIV_WCK and the system clock HCK are not synchronized with each other, the training information signal COMPARE_SIG (TRAINING_INFO_SIG) keeps a logic low level. Meanwhile, in a period ⑦, in which the phases of the data clocks WCK and DIV_WCK do not need to vary anymore since the data clocks WCK and DIV_WCK are synchronized with the system clock HCK, the training information signal COMPARE_SIG (TRAINING_INFO_SIG) keeps a logic high level.

Consequently, in the circuit for performing the clock alignment training, the phase comparison unit 140 continuously compares the phase of the data clock WCK with that of the system clock HCK inputted from the external controller by performing the clock alignment training operation and the signal transfer unit 160 transmits the comparison result, i.e., the training information signal COMPARE_SIG (TRAINING_INFO_SIG), to the external controller.

Figure 3:
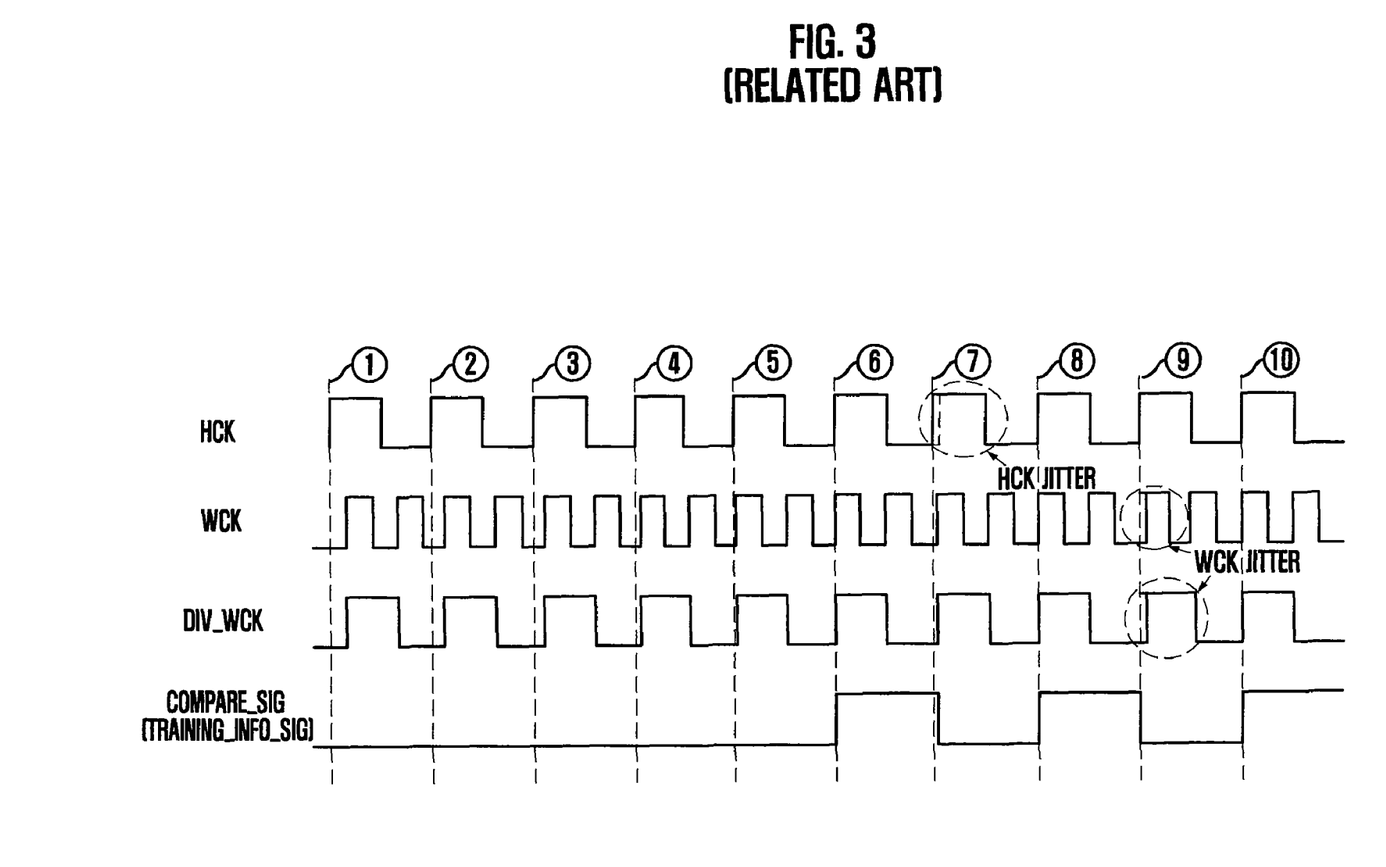
FIG. 3 is a timing diagram illustrating operational waveforms in case that the circuit illustrated in FIG. 1 performs the clock alignment training operation in an abnormal state due to jitter.

FIG. 3 is a timing diagram illustrating operational waveforms in case that the circuit illustrated in FIG. 1 performs the clock alignment training in an abnormal state due to jitter.

Referring to FIG. 3, it is noticed that operational waveforms from a period ①, in which the clock alignment training operation does not start to periods ②, ③, ④, ⑤ and ⑥, in which the phase of the data clock WCK is synchronized with that of the system clock HCK, are the same as those of the periods in which the phases of the data clock WCK and the system clock HCK are changed from a unsynchronized state to a synchronized state when the clock alignment training is performed in the normal state illustrated in FIG. 2.

Namely, while the phase of the system HCK is fixed, the phases of the data clocks WCK and DIV_WCK vary according to the logic level of the training information signal COMPARE_SIG (TRAINING_INFO_SIG) transmitted to the external controller through the signal transfer unit 160, so that the phase of the data clock WCK is synchronized with that of the system clock HCK.

However, unlike the operational waveforms in case that the clock alignment training operation is performed in the normal state illustrated in FIG. 2, the phases of the data clock WCK and the system clock HCK may be changed by noise or jitter, immediately after the phase of the data clock WCK is synchronized with that of the system clock HCK through the normal clock alignment training operation, i.e. in the period ⑥. As a result, there may occur a problem that the synchronized phases of the data clock WCK and the system clock HCK become unsynchronized again in periods ⑦ and ⑨.

In particular, in the periods ②, ③, ④, ⑤ and ⑥, in which the phases of the data clocks WCK and DIV_WCK vary since the phases of the data clocks WCK and DIV_WCK are unsynchronized with that of the system clock HCK, the training information signal COMPARE_SIG (TRAINING_INFO_SIG) keeps a logic low state continuously. Then, the clock alignment training operation is normally performed and, thus, at the moment when the phase of the data clock WCK is synchronized with that of the system clock HCK, the training information signal COMPARE_SIG (TRAINING_INFO_SIG) transits to a logic high state. However, directly after the training information signal COMPARE_SIG (TRAINING_INFO_SIG) transits to a logic high state, the phase of the system clock HCK is changed by noise or jitter in the period ⑦ and, thus, the phase of the data clock WCK is unsynchronized with that of the system clock HCK again, so that the training information signal COMPARE_SIG (TRAINING_INFO_SIG) transits to the logic low state again.

Likewise, directly after noticing that the training information signal COMPARE_SIG (TRAINING_INFO_SIG) transits to the logic low state according to the phase change of the system clock HCK due to noise or jitter, the synchronization of the phases of the data clock WCK and the system clock HCK succeeds by changing the phase of the data clock WCK. However, directly after that the phase of the data clock WCK is changed, the phase of the data clock WCK is changed by noise or jitter in the period ⑨ and thus the phase of the data clock WCK is unsynchronized with that of the system clock HCK again. As a result, the training information signal COMPARE_SIG (TRAINING_INFO_SIG) transits to the logic low state again.

As described above, although the conventional circuit for performing the clock alignment training operation synchronizes the phase of the data clock WCK with that of the system clock HCK, the phase of the system clock HCK and the phase of the data clock WCK may vary due to noise or jitter and thus the training information signal COMPARE_SIG (TRAINING_INFO_SIG) reporting the result of the clock alignment training operation to the external controller may change its logic level from the logic low state to the logic high state and then from the logic high state to the logic low state continuously.

If the logic level of the training information signal COMPARE_SIG (TRAINING_INFO_SIG) is continuously changed by noise or jitter, there occurs confusion in the external controller that should synchronize the phase of the data clock WCK with that of the system clock HCK and transfer the synchronized clocks to the semiconductor memory device. This confusion forces it to take a long time to perform the clock alignment training operation or there may occur malfunction in the external controller by the wrong clock alignment training.

SUMMARY OF THE INVENTION

Embodiments of the present subject matter are directed to providing a circuit capable of preventing a wrong result of the clock alignment training from being transferred to an external controller although the wrong result of the clock alignment training is induced by an effect of noise or jitter generated during the clock alignment training that is required in a semiconductor memory device operating at a high speed.

In accordance with an aspect of the disclosure, there is provided a semiconductor memory device including: a clock input unit configured to receive a first clock and a second clock from the external; a frequency conversion unit configured to convert a frequency of the second clock so that the frequency of the second clock becomes identical to a frequency of the first clock; a phase comparison unit configured to compare a phase of the first clock and that of a clock outputted from the frequency conversion unit, and output a comparison signal corresponding to the comparison result; a logic level change unit configured to change a logic level of a training information signal when a logic level of the comparison signal is fixed for a given time after being changed; and a signal transfer unit configured to transfer the training information signal to the external.

In accordance with another aspect of the disclosure, there is provided a semiconductor memory device including: a clock input unit configured to receive a first clock and a second clock from the external; a phase comparison unit configured to compare a phase of the first clock with that of the second clock, and output a comparison signal corresponding to the comparison result; a logic level change unit configured to change a logic level of a training information signal when a logic level of the comparison signal is fixed for a given time after being changed; and a signal transfer unit configured to transfer the training information signal to the external.

DESCRIPTION OF SPECIFIC EMBODIMENTS

Other objects and advantages of the present subject matter can be understood by the following description, and become apparent with reference to the embodiments of the present subject matter.

Figure 4:
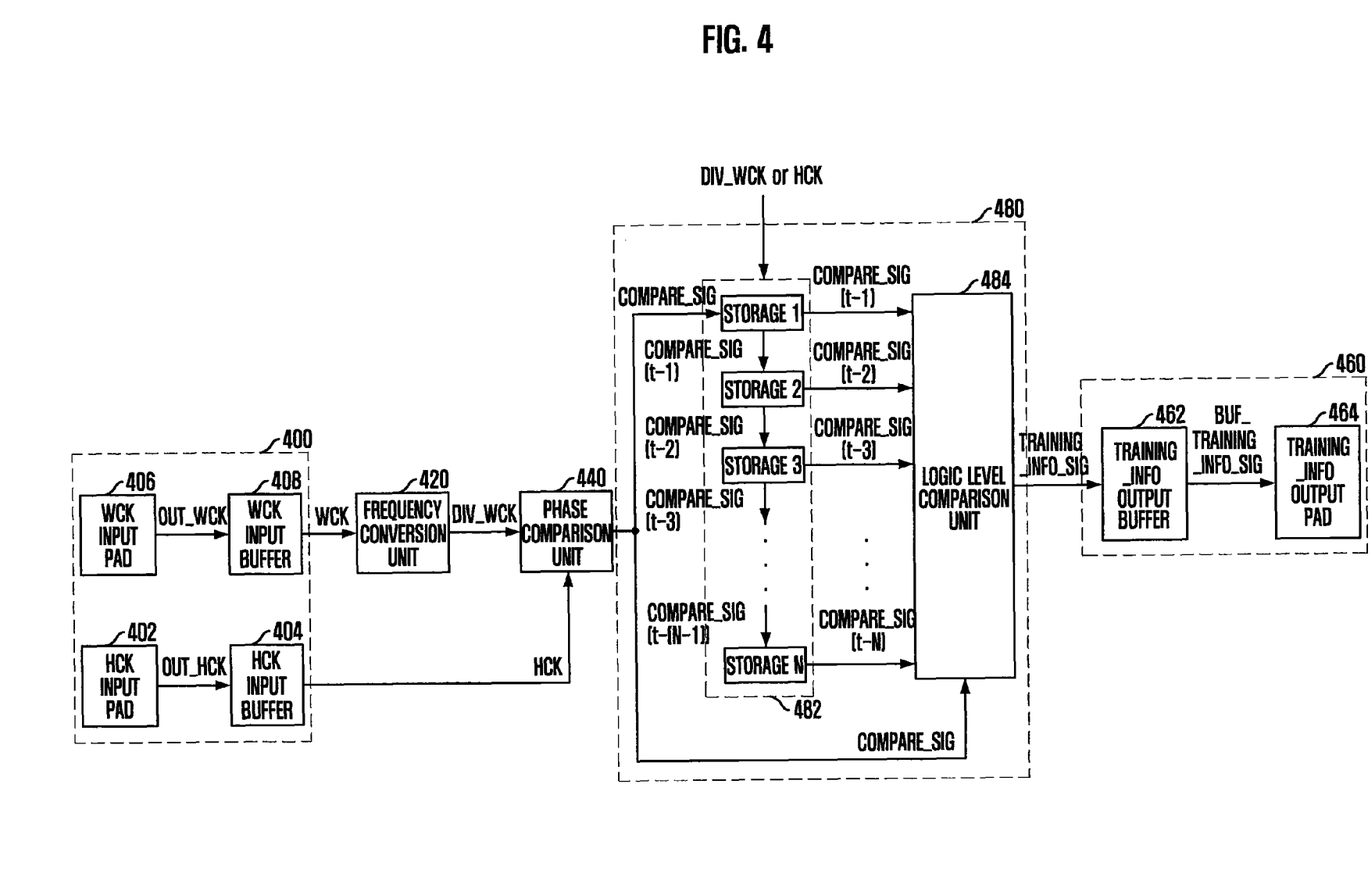
FIG. 4 illustrates a block diagram of a circuit for performing a clock alignment training operation in accordance with an embodiment of the present subject matter.

FIG. 4 illustrates a block diagram of a circuit for performing a clock alignment training operation in accordance with an embodiment of the present subject matter.

The circuit for performing the clock alignment training illustrated in FIG. 4 has the same operational object as that of the conventional circuit for performing the clock alignment training illustrated in FIG. 1. That is, the circuit illustrated in FIG. 4 receives a system clock OUT_HCK and a data clock OUT_WCK from an external controller, detects a phase difference of the system clock OUT_HCK and the data clock OUT_WCK, and transmits the detected result to the external controller.

Referring to FIG. 4, the circuit for performing the clock alignment training operation in accordance with the embodiment of the present subject matter includes a clock input unit 400, a frequency conversion unit 420, a phase comparison unit 440, a logic level change unit 480 and a signal transfer unit 460.

The clock input unit 400 receives a system clock OUT_HCK, which synchronizes input points of an address signal and a command signal, and a data clock OUT_WCK, which synchronizes an input point of a data signal, from an external controller and buffers the system clock OUT_HCK and the data clock OUT_WCK to output a system clock HCK and a data clock WCK. The data clock WCK has a frequency higher than that of the system clock HCK.

The frequency conversion unit 420 converts the frequency of the data clock WCK so that the frequency of the data clock WCK becomes identical to that of the system clock HCK.

The phase comparison unit 440 compares a phase of the system clock HCK with that of a clock DIV_WCK outputted from the frequency conversion unit 420 to thereby output a comparison signal COMPARE_SIG corresponding to the comparison result.

The logic level change unit 480 changes a logic level of a training information signal TRAINING_INFO_SIG when a logic level of the comparison signal COMPARE_SIG is fixed for a preset time after the logic level of the comparison signal COMPARE_SIG is changed, wherein the preset time corresponds to a time taken for repeating the period of the system clock HCK or the clock DIV_WCK outputted from the frequency conversion unit 420 for preset times.

The signal transfer unit 460 transmits the training information signal TRAINING_INFO_SIG to the external controller.

Herein, the logic level change unit 480 includes a plurality of storages 482 and a logic level comparison unit 484.

The storages 482 store the comparison signal COMPARE_SIG as many as preset times for each period of the system clock HCK or the clock DIV_WCK outputted from the frequency conversion unit 420.

The logic level comparison unit 484 compares the logic level of the comparison signal COMPARE_SIG with each of logic levels of signals COMPARE_SIG(t-1), COMPARE_SIG(t-2), COMPARE_SIG(t-3), . . . , and COMPARE_SIG(t-N) stored in the storages 482, e.g., a first storage, a second storage, a third storage, . . . , and an Nth storage, and determines a logic level of the training information signal TRAINING_INFO_SIG in response to the comparison result.

The clock input unit 400 includes a system clock (HCK) input pad 402 for receiving a system clock OUT_HCK from the external controller, a system clock (HCK) input buffer 404 for buffering the system clock OUT_HCK coupled through the HCK input pad 402 and outputting the system clock HCK, a data clock (WCK) input pad 406 for receiving a data clock OUT_WCK from the external controller, wherein the data clock OUT_WCK has a frequency higher than that of the system clock OUT_HCK, and a data clock (WCK) input buffer 408 for buffering the data clock OUT_WCK coupled through the WCK input pad 406 and outputting the data clock WCK.

The signal transfer unit 460 includes a training information signal (TRAINING_INFO) output buffer 462 for buffering the training information signal TRAINING_INFO_SIG and outputting a buffered training information signal BUF_TRAINING_INFO_SIG, and a training information signal (TRAINING_INFO) output pad 464 for transferring the buffered training information signal BUF_TRAINING_INFO_SIG outputted from the TRAINING_INFO output buffer 462 to the external controller.

Figure 5:
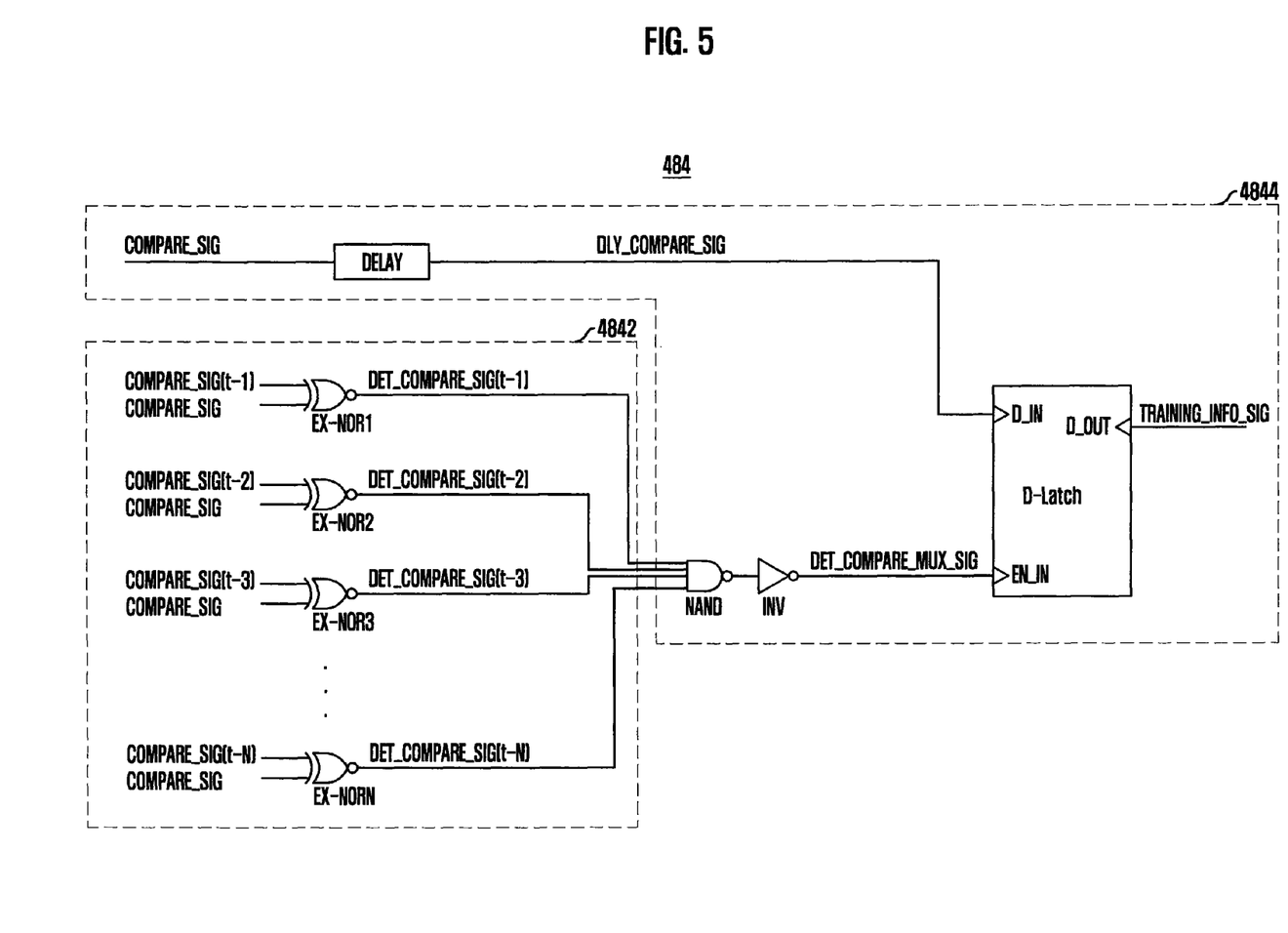
FIG. 5 illustrates a detailed circuit diagram of a logic level comparison unit included in a logic level change unit among components constructing the circuit for performing the clock alignment training operation illustrated in FIG. 4.

FIG. 5 illustrates a detailed circuit diagram of the logic level comparison unit 484 included in the logic level change unit 480 among the components constituting the circuit for performing the clock alignment training operation illustrated in FIG. 4.

Referring to FIG. 5, the logic level comparison unit 484 included in the logic level change unit 480 includes a plurality of detectors 4842 and a logic level determination unit 4844.

The detectors 4842 receive the comparison signal COMPARE_SIG and the signals COMPARE_SIG(t-1), COMPARE_SIG(t-2), COMPARE_SIG(t-3), . . . , and COMPARE_SIG(t-N) stored in the storages 482 and detect whether the logic level of the comparison signal COMPARE_SIG coincides with the logic levels of the signals COMPARE_SIG(t-1), COMPARE_SIG(t-2), COMPARE_SIG(t-3), . . . , and COMPARE_SIG(t-N).

The logic level determination unit 4844 determines the logic level of the training information signal TRAINING_INFO_SIG in response to the comparison signal COMPARE_SIG and signals DET_COMPARE_SIG(t-1), DET_COMPARE_SIG(t-2), DET_COMPARE_SIG(t-3), . . . , and DET_COMPARE_SIG(t-N) outputted from the detectors 4842, e.g., a first detector, a second detector, a third detector, . . . , and an Nth detector.

Herein, the detectors 4842 include a plurality of exclusive NOR gates EX-NOR1, EX-NOR2, EX-NOR3, . . . , and EX-NORN each of which receives a corresponding one of the signals COMPARE_SIG(t-1), COMPARE_SIG(t-2), COMPARE_SIG(t-3), . . . , and COMPARE_SIG(t-N) stored in the storages 482 as a first input and the comparison signal COMPARE_SIG as a second input, and performs a negative logical sum operation for the received signals.

The logic level determination unit 4844 includes a negative logical product gate NAND and an inverter INV serially connected to each other to receive the detection signals DET_COMPARE_SIG(t-1), DET_COMPARE_SIG(t-2), DET_COMPARE_SIG(t-3), . . . , and DET_COMPARE_SIG(t-N) outputted from the exclusive NOR gates EX-NOR1, EX-NOR2, EX-NOR3, . . . , and EX-NORN and perform a logical product operation for the received signals. The logic level determination unit 4844 further includes a delay for delaying the comparison signal COMPARE_SIG for a given time, and a D-latch for outputting an output signal DLY_COMPARE_SIG of the delay coupled through a data input terminal D_IN as the training information signal TRAINING_INFO_SIG through a data output terminal D_OUT in response to an output signal DET_COMPARE_MUX_SIG of the NAND gate NAND and the inverter INV connected in series coupled through an enable input terminal EN_IN. In the above, the given time corresponds to a time taken for the exclusive NOR gates EX-NOR1, EX-NOR2, EX-NOR3, . . . , and EX-NORN, the NAND gate NAND and the inverter INV to operate and then for the signals DET_COMPARE_SIG(t-1), DET_COMPARE_SIG(t-2), DET_COMPARE_SIG(t-3), . . . , and DET_COMPARE_SIG(t-N) to be outputted.

Hereinafter, there is described an operation of the circuit for performing the clock alignment training operation in accordance with the embodiment of the present subject matter with reference to the above configuration.

First of all, the storages 482, i.e., the first storage, the second storage, the third storage, . . . , and the Nth storage, among the components constituting the logic level change unit 480 store the comparison signal COMPARE_SIG as many as the preset times for each period of the system clock HCK or the clock DIV_WCK outputted from the frequency conversion unit 420 in a first in first out (FIFO) manner.

Referring to the storages 482, i.e., the first storage, the second storage, the third storage, . . . , and the Nth storage, in detail, the storages 482 outputs the signals COMPARE_SIG(t-1), COMPARE_SIG(t-2), COMPARE_SIG(t-3), . . . , and COMPARE_SIG(t-N) stored in the storages, i.e., the first storage, the second storage, the third storage, . . . , and the Nth storage, to the logic level comparison unit 484 for each period of the system clock HCK or the clock DIV_WCK outputted from the frequency conversion unit 420, as well as storing the signals stored therein in the next storages, i.e., the second storage, the third storage, . . . , and the Nth storage. At this time, the signal COMPARE_SIG(t-N) stored in the last storage, i.e., the Nth storage, is deleted since there is no next storage therefor and a current comparison signal COMPARE_SIG is stored in the first storage.

At the moment, the storages 482, i.e., the first storage, the second storage, the third storage, . . . , and the Nth storage, delete the signals COMPARE_SIG(t-1), COMPARE_SIG(t-2), COMPARE_SIG(t-3), . . . , and COMPARE_SIG(t-N) stored therein in response to the system clock HCK or the clock DIV_WCK outputted from the frequency conversion unit 420, and stores inputted signals COMPARE_SIG, COMPARE_SIG(t-1), COMPARE_SIG(t-2), COMPARE_SIG(t-3), . . . , and COMPARE_SIG(t-N-1) therein.

Therefore, the storages 482, i.e., the first storage, the second storage, the third storage, . . . , and the Nth storage, store the comparison signals COMPARE_SIG, COMPARE_SIG(t-1), COMPARE_SIG(t-2), COMPARE_SIG(t-3), . . . , and COMPARE_SIG(t-N-1) corresponding to a preset time required in repeating the period of the system clock HCK or the clock DIV_WCK as many as the preset times, and delete the stored comparison signals in the FIFO manner.

The comparison signals COMPARE_SIG, COMPARE_SIG(t-1), COMPARE_SIG(t-2), COMPARE_SIG(t-3), . . . , and COMPARE_SIG(t-N-1) stored in the storages 482 at the present time may be outputted to the logic level comparison unit 484 as COMPARE_SIG(t-1), COMPARE_SIG(t-2), COMPARE_SIG(t-3), . . . , and COMPARE_SIG(t-N) after one period of the system clock HCK or the clock DIV_WCK is passed.

The logic level comparison unit 484 included in the logic level change unit 480 compares each of the comparison signals COMPARE_SIG(t-1), COMPARE_SIG(t-2), COM- PARE_SIG(t-3), . . . , and COMPARE_SIG(t-N) stored in the storages 482 with the comparison signal COMPARE_SIG. Then, if the logic levels of the comparison signals COMPARE_SIG(t-1), COMPARE_SIG(t-2), COMPARE_SIG(t-3), . . . , and COMPARE_SIG(t-N) are identical to that of the comparison signal COMPARE_SIG, the logic level comparison unit 484 changes the logic level of the training information signal TRAINING_INFO_SIG. On the other hand, if at least one of the logic levels of the comparison signals COMPARE_SIG(t-1), COMPARE_SIG(t-2), COMPARE_SIG(t-3), . . . , and COMPARE_SIG(t-N) is not identical to that of the comparison signal COMPARE_SIG, the logic level comparison unit 484 does not change the logic level of the training information signal TRAINING_INFO_SIG.

Hereinafter, the logic level comparison unit 484 of the logic level change unit 480 is described in detail.

The plurality of detectors 4842 included in the logic level comparison unit 484 detect whether or not each of the logic levels of the comparison signals COMPARE_SIG(t-1), COMPARE_SIG(t-2), COMPARE_SIG(t-3), . . . , and COMPARE_SIG(t-N) stored in the storages 482 is identical to that of the comparison signal COMPARE_SIG.

For instance, in case that the plurality of detectors 4842 include the plurality of exclusive NOR gates EX-NOR1, EX-NOR2, EX-NOR3, and EX-NORN, if each of the logic levels of the comparison signals COMPARE_SIG(t-1), COMPARE_SIG(t-2), COMPARE_SIG(t-3), . . . , and COMPARE_SIG(t-N) stored in the storages 482 is identical to that of the comparison signal COMPARE_SIG, the detectors 4842 output the detection signals DET_COMPARE_SIG(t-1), DET_COMPARE_SIG(t-2), DET_COMPARE_SIG(t-3), . . . , and DET_COMPARE_SIG(t-N) having a logic high level. On the other hand, if each of the logic levels of the comparison signals COMPARE_SIG(t-1), COMPARE_SIG(t-2), COMPARE_SIG(t-3), . . . , and COMPARE_SIG(t-N) stored in the storages 482 is not identical to that of the comparison signal COMPARE_SIG, the detectors 4842 output the detection signals DET_COMPARE_SIG(t-1), DET_COMPARE_SIG(t-2), DET_COMPARE_SIG(t-3), . . . , and DET_COMPARE_SIG(t-N) having a logic low level.

The logic level determination unit 4844 included in the logic level comparison unit 484 changes the logic level of the training information signal TRAINING_INFO_SIG to be the same as that of the comparison signal COMPARE_SIG if all of the detection signals DET_COMPARE_SIG(t-1), DET_COMPARE_SIG(t-2), DET_COMPARE_SIG(t-3), . . . , and DET_COMPARE_SIG(t-N) have the logic high level. On the other hand, if at least one of the detection signals DET_COMPARE_SIG(t-1), DET_COMPARE_SIG(t-2), DET_COMPARE_SIG(t-3), . . . , and DET_COMPARE_SIG(t-N) has the logic low level, the logic level determination unit 4844 keeps the previous logic level of the training information signal TRAINING_INFO_SIG regardless of the logic level of the comparison signal COMPARE_SIG.

Figure 6:
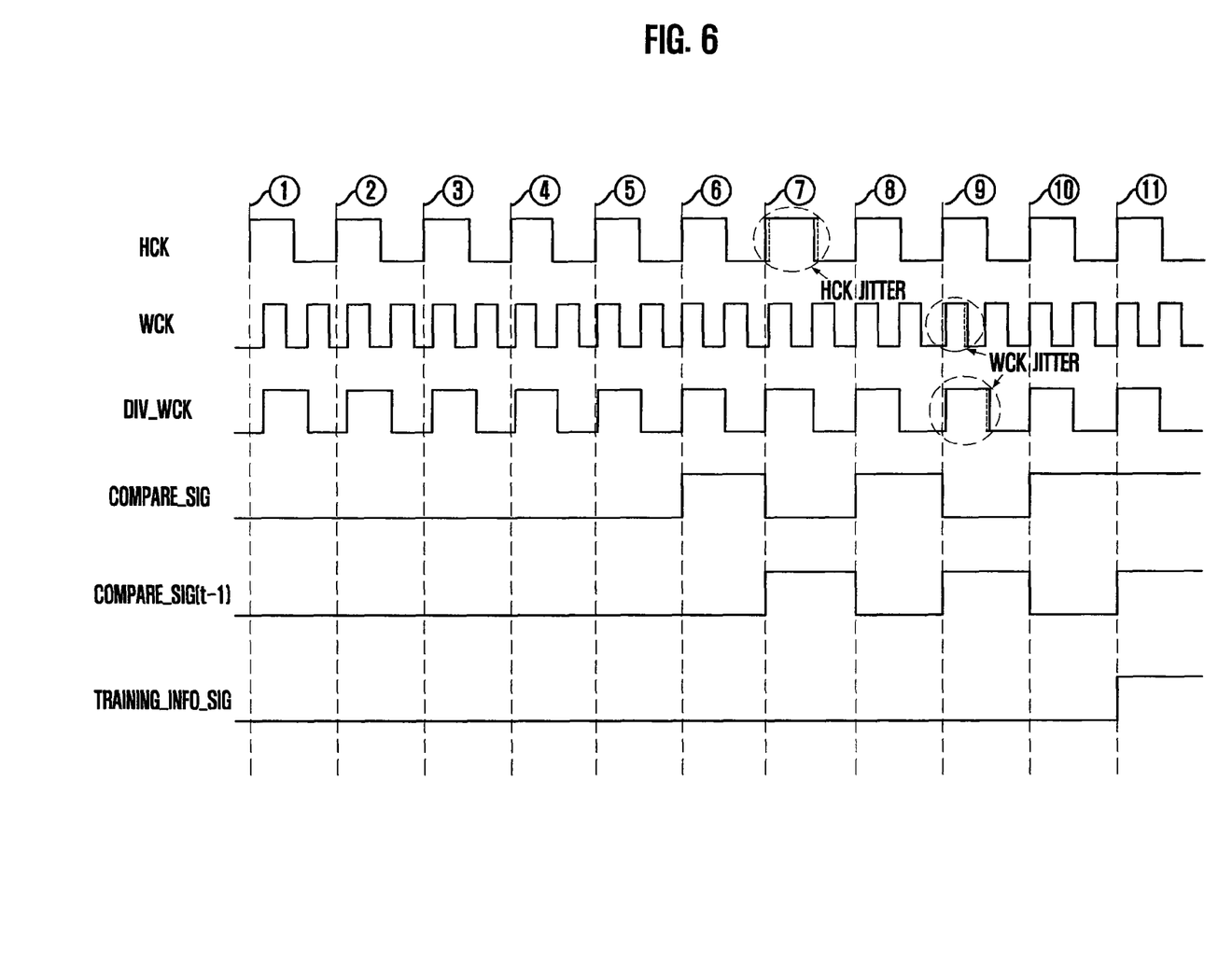
FIG. 6 is a timing diagram illustrating operational waveforms of the circuit for performing the clock alignment training operation illustrated in FIG. 4.

FIG. 6 is a timing diagram illustrating operational waveforms of the circuit for performing the clock alignment training operation illustrated in FIG. 4.

The waveforms of the circuit for performing the clock alignment training operation illustrated in FIG. 6 are obtained when N is 1, wherein N represents the number of storages included in the storages 482. That is, if the circuit for performing the clock alignment training operation illustrated in FIG. 4 includes one storage 482, the waveforms in FIG. 6 are obtained.

Referring to FIG. 6, the waveforms obtained from a starting point of the clock alignment training operation, i.e., a period ①, to periods ②, ③, ④, ⑤ and ⑥, in which the phases of the data clock WCK and the system clock HCK are synchronized, show that the data clock WCK and the system clock HCK inputted to the circuit for performing the clock alignment training operation in accordance with the present subject matter from the external controller are changed from a state where the phases of the data clock WCK and the system clock HCK are unsynchronized to a state where the phases of the data clock WCK and the system clock HCK are synchronized. Therefore, it is noticed that the waveforms in the periods ①, ②, ③, ④, ⑤ and ⑥ are the same as those obtained from the operation of the circuit for the clock alignment training according to the prior art illustrated in FIGS. 2 and 3.

That is, the phase of the data clock WCK and the phase of the system clock HCK are synchronized by the phases of the data clocks WCK and DIV_WCK that vary according to the logic level of the training information signal COMPARE_SIG (TRAINING_INFO_SIG) while the phase of the system clock HCK is fixed. The training information signal COMPARE_SIG (TRAINING_INFO_SIG) is transmitted to the external controller through the signal transfer unit 460.

Likewise the waveforms in case of performing the clock alignment training operation in the abnormal state illustrated in FIG. 3, the phases of the system clock HCK and the data clock WCK may be changed by noise or jitter immediately after the period ⑥, in which the phase of the data clock WCK is synchronized with that of the system clock HCK through the clock alignment training operation. Thus, the phase of the data clock WCK becomes unsynchronized with that of the system clock HCK again in periods ⑦ and ⑨.

However, since the circuit in accordance with the present subject matter performs the clock alignment training operation differently from the circuit for performing the clock alignment training operation in the abnormal state illustrated in FIG. 3, although the phase of the system clock HCK and the phase of the data clock WCK are instantaneously unsynchronized by noise or jitter immediately after the period ⑥, there does not occur a problem of the logic level of the training information signal TRAINING_INFO_SIG being changed.

In particular, the waveforms illustrated in FIG. 6 show that the comparison signal COMPARE_SIG and the training information signal TRAINING_INFO_SIG keep the logic low state in the periods ②, ③, ④, ⑤ and ⑥ where the phases of the data clocks WCK and DIV_WCK are varying for the synchronization with the phase of the system clock HCK, which are the same as those in the conventional clock alignment training performing circuit illustrated in FIGS. 2 and 3.

However, at the moment ⑥ where the phase synchronization of the data clock WCK and the system clock HCK is achieved through the normal clock alignment training operation, the comparison signal COMPARE_SIG and the training information signal TRAINING_INFO_SIG are changed to a logic high state in the conventional clock alignment training performing circuit as illustrated in FIGS. 2 and 3, whereas, according to the operation of the inventive clock alignment training circuit illustrated in FIG. 6, the logic level of the comparison signal COMPARE_SIG is changed to a logic high state while the logic level of the comparison signal COMPARE_SIG(t-1) stored in the storage 482 keeps a logic low state without being changed to the logic high state, so that the logic level of the training information signal TRAINING_INFO_SIG continuously maintains the logic low state.

When the phase of the data clock WCK is unsynchronized with that of the system clock HCK since the phase of the system clock HCK is changed in the period ⑦ by noise or jitter, in the operation of the conventional clock alignment training performing circuit illustrated in FIGS. 2 and 3, the logic levels of the comparison signal COMPARE_SIG and the training information signal TRAINING_INFO_SIG are simultaneously changed to the logic low state. However, in this case, according to the operation of the inventive clock alignment training circuit illustrated in FIG. 6, since the logic level of the comparison signal COMPARE_SIG is changed to a logic low level while the logic level of the comparison signal COMPARE_SIG(t-1) stored in the storage 482 is not changed to the logic low state after being changed to the logic high state, the logic level of the training information signal TRAINING_INFO_SIG continuously maintains the logic low state.

Likewise, if the phase of the data clock WCK is changed through the continuous clock alignment training operation, the phase of the data clock WCK is synchronized with that of the system clock HCK in a period ⑧, so that, in the conventional clock alignment training performing circuit whose operation is described in FIGS. 2 and 3, the logic levels of the comparison signal COMPARE_SIG and the training information signal TRAINING_INFO_SIG are changed to the logic high state simultaneously. On the other hand, according to the operation of the inventive clock alignment training circuit illustrated in FIG. 6, the logic level of the comparison signal COMPARE_SIG is changed to the logic high state while the logic level of the comparison signal COMPARE_SIG(t-1) stored in the storage 482 keeps the logic low state without being changed to the logic high state, so that the logic level of the training information signal TRAINING_INFO_SIG continuously maintains the logic low state.

Then, when the phase of the data clock WCK is unsynchronized with that of the system clock HCK since the phase of the system clock HCK is changed again in the period ⑨ by noise or jitter, in the operation of the conventional clock alignment training performing circuit illustrated in FIGS. 2 and 3, the logic levels of the comparison signal COMPARE_SIG and the training information signal TRAINING_INFO_SIG are simultaneously changed to the logic low state. However, in this case, according to the operation of the inventive clock alignment training circuit illustrated in FIG. 6, since the logic level of the comparison signal COMPARE_SIG is changed to a logic low state while the logic level of the comparison signal COMPARE_SIG(t-1) stored in the storage 482 is not changed to the logic low state after being changed to the logic high state, the logic level of the training information signal TRAINING_INFO_SIG continuously maintains the logic low state.

Finally, the phase of the data clock WCK is changed through the continuous clock alignment training operation and thus the phase of the data clock WCK is synchronized with that of the system clock HCK from a period ⑩. Accordingly, after a time taken for repeating the period of the system clock HCK or the clock DIV_WCK twice, i.e., after the periods ⑪ and ⑪ are passed, the logic level of the comparison signal COMPARE_SIG and the logic level of the comparison signal COMPARE_SIG(t-1) stored in the storage 482 are consistently the logic high state and, thus, the logic level of the training information signal TRAINING_INFO_SIG is changed to the logic high state.

As described above, in accordance with the embodiment of the present subject matter, the clock alignment training performing circuit can control to make the result of the clock alignment training operation not directly transferred to the external controller, although the phase difference of the system clock HCK and the data clock WCK is wrongly detected as noise or jitter occur in the data clock WCK and the system clock HCK during performing the clock alignment training operation. As a result, it is possible to prevent the external controller from misjudging the phase difference of the system clock HCK and the data clock WCK based on the wrong result of the clock alignment training operation.

That is, although output waveforms due to the result of the clock alignment training operation are unstably shaken by the effect of noise or jitter during the clock alignment training operation that is required in the semiconductor memory device operating at a high speed in accordance with the present subject matter, the inventive circuit transfers the output waveforms to the external controller after the output waveforms are stabilized. Therefore, there is an effect of preventing the external controller from misjudging the phase difference of the data clock and the system clock according to the result of the clock alignment training operation.

As a result, it is possible to prevent the malfunction of the semiconductor memory device due to the wrong clock alignment training or to avoid a long time taken for performing the clock alignment training operation.

While the present invention has been described with respect to the specific embodiments, it will be apparent to those skilled in the art that various changes and modifications may be made without departing from the spirit and scope of the invention as defined in the following claims.

For instance, in the above embodiments, the illustrated logic gates and transistors may be implemented to have different locations and types according to polarities of signals inputted thereto.

What is claimed is:

1. A semiconductor memory device, comprising:
a clock input unit configured to receive a first clock and a second clock from the external;
a frequency conversion unit configured to convert a frequency of the second clock so that the frequency of the second clock becomes identical to a frequency of the first clock;
a phase comparison unit configured to compare a phase of the first clock with that of a clock outputted from the frequency conversion unit, and output a comparison signal corresponding to the comparison result;
a logic level change unit configured to change a logic level of a training information signal when a logic level of the comparison signal is fixed for a given time after being changed; and
a signal transfer unit configured to transfer the training information signal to the external.

2. The semiconductor memory device of claim 1, wherein the logic level change unit comprises:
a plurality of storages configured to store the comparison signal as many as preset times for each period of the first clock or the clock outputted form the frequency conversion unit; and
a logic level comparison unit configured to compare a logic level of the comparison signal with each of logic levels of signals stored in the plurality of storages, and determine the logic level of the training information signal in response to said comparison result.

3. The semiconductor memory device of claim 2, wherein the logic level comparison unit comprises:
a plurality of detection units configured to receive the comparison signal and the signals stored in the storages and detect whether the logic level of the comparison signal is identical to the logic levels of the signals stored in the storages; and a logic level determination unit configured to determine the logic level of the training information signal in response to the comparison signal and signals outputted from the detection units.

4. The semiconductor memory device of claim 2, wherein the plurality of storages store the comparison signal as many as the preset times for each period of the first clock or the clock outputted from the frequency conversion unit in a first in first out (FIFO) manner.

5. The semiconductor memory device of claim 2, wherein the logic level comparison unit changes the logic level of the training information signal in case that the logic levels of all of the signals stored in the storages are identical to the logic level of the comparison signal, and keeps the logic level of the training information signal without change in case that at least one of the logic levels of the signals stored in the storages is not identical to the logic level of the comparison signal.

6. The semiconductor memory device of claim 1, wherein the given time corresponds to a time taken for repeating a period of the first clock or the clock outputted from the frequency conversion unit for preset times.

7. The semiconductor memory device of claim 1, wherein the first clock is used to synchronize input points of an address signal and a command signal and the second clock is used to synchronize an input point of a data signal.

8. A semiconductor memory device, comprising:
   a clock input unit configured to receive a first clock and a second clock from the external;
   a phase comparison unit configured to compare a phase of the first clock with that of the second clock, and output a comparison signal corresponding to the comparison result;
   a logic level change unit configured to change a logic level of a training information signal when a logic level of the comparison signal is fixed for a given time after being changed; and
   a signal transfer unit configured to transfer the training information signal to the external.

9. The semiconductor memory device of claim 8, wherein the logic level change unit comprises:

a plurality of storages configured to store the comparison signal as many as preset times for each period of the first clock or the second clock; and
   a logic level comparison unit configured to compare the logic level of the comparison signal with each of logic levels of signals stored in the plurality of storages, and determine the logic level of the training information signal in response to said comparison result.

10. The semiconductor memory device of claim 9, wherein the logic level comparison unit comprises:
   a plurality of detection units configured to receive the comparison signal and the signals stored in the storages and detect whether the logic level of the comparison signal is identical to the logic levels of the signals stored in the storages; and
   a logic level determination unit configured to determine the logic level of the training information signal in response to the comparison signal and signals outputted from the detection units.

11. The semiconductor memory device of claim 9, wherein the plurality of storages store the comparison signal as many as the preset times for each period of the first clock or the clock outputted from the frequency conversion unit in a first in first out (FIFO) manner.

12. The semiconductor memory device of claim 9, wherein the logic level comparison unit changes the logic level of the training information signal in case that the logic levels of all of the signals stored in the storages are identical to the logic level of the comparison signal, and keeps the logic level of the training information signal without change in case that at least one of the logic levels of the signals stored in the storages is inconsistent with the logic level of the comparison signal.

13. The semiconductor memory device of claim 8, wherein the given time corresponds to a time taken for repeating a period of the first clock or the second clock for preset times.

14. The semiconductor memory device of claim 8, wherein the first clock is used to synchronize input points of an address signal and a command signal and the second clock is used to synchronize an input point of a data signal.

* * * * *